US010982313B2

(12) United States Patent
Derflinger et al.

(10) Patent No.: US 10,982,313 B2
(45) Date of Patent: Apr. 20, 2021

(54) COATED BODY AND METHOD FOR PRODUCTION OF THE BODY

(71) Applicants: Kennametal Inc., Latrobe, PA (US); Oerlikon Surface Solutions AG, Pfäffikon, Pfäffikon (CH)

(72) Inventors: Volker Derflinger, Feldkirch (AT); Joern Kohlscheen, Bremen (DE)

(73) Assignees: KENNAMETAL INC., Latrobe, PA (US); OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 111 days.

(21) Appl. No.: 16/300,476

(22) PCT Filed: May 4, 2017

(86) PCT No.: PCT/EP2017/060592
§ 371 (c)(1),
(2) Date: Nov. 9, 2018

(87) PCT Pub. No.: WO2017/194372
PCT Pub. Date: Nov. 16, 2017

(65) Prior Publication Data
US 2019/0226075 A1   Jul. 25, 2019

(30) Foreign Application Priority Data
May 11, 2016 (DE) .......................... 102016108734.3

(51) Int. Cl.
| C23C 14/06 | (2006.01) |
| C23C 14/00 | (2006.01) |
| C23C 28/04 | (2006.01) |
| C23C 14/34 | (2006.01) |

(52) U.S. Cl.
CPC ...... *C23C 14/0042* (2013.01); *C23C 14/0021* (2013.01); *C23C 14/0641* (2013.01); *C23C 14/0676* (2013.01); *C23C 28/042* (2013.01); *C23C 28/044* (2013.01); *C23C 14/3407* (2013.01)

(58) Field of Classification Search
CPC ............ C23C 14/0042; C23C 14/0021; C23C 14/0641; C23C 14/0676; C23C 14/3407
See application file for complete search history.

(56) References Cited

U.S. PATENT DOCUMENTS

| 5,246,787 | A | * | 9/1993 | Schulz | ................... | A61B 17/00 |
| | | | | | | 249/116 |
| 5,879,823 | A | | 3/1999 | Prizzi et al. | | |
| 7,000,000 | B1 | | 2/2006 | O'Brien | | |
| 7,670,674 | B2 | | 3/2010 | Schier | | |
| 8,071,211 | B2 | | 12/2011 | Koike et al. | | |
| 8,309,236 | B2 | | 11/2012 | Tamagaki et al. | | |
| 8,709,583 | B2 | | 4/2014 | Schier et al. | | |
| 2008/0090099 | A1 | | 4/2008 | Ramm et al. | | |
| 2010/0062257 | A1 | | 3/2010 | Morstein et al. | | |
| 2011/0268514 | A1 | | 11/2011 | Schier et al. | | |
| 2012/0009402 | A1 | | 1/2012 | Johansson | | |
| 2012/0021137 | A1 | | 1/2012 | Quinto et al. | | |
| 2013/0216804 | A1 | | 8/2013 | Schier | | |
| 2014/0147221 | A1 | | 5/2014 | Schier | | |
| 2014/0193637 | A1 | | 7/2014 | Schier et al. | | |
| 2015/0064431 | A1 | * | 3/2015 | Sottke | ................... | C23C 16/308 |
| | | | | | | 428/216 |

FOREIGN PATENT DOCUMENTS

| CN | 101970717 A | 2/2011 | | |
| CN | 102011093 A | 2/2012 | | |
| CN | 102826863 A | 12/2012 | | |
| CN | 102206808 A | 6/2013 | | |
| CN | 203004438 U | 6/2013 | | |
| CN | 203495332 U | 3/2014 | | |
| DE | 102008013965 A1 | 9/2009 | | |
| DE | 102010052687 A1 | 5/2012 | | |
| DE | 102010052687 A1 | * | 5/2012 | ........... C23C 28/042 |
| DE | 102013005437 A1 | 10/2014 | | |

(Continued)

OTHER PUBLICATIONS

Machine translation of German Patent, DE102010052687-A1. (Year: 2012).*
Machine Translation of German Patent, DE102010052687-Ai (Year: 2012).*
Pilkington A,et al. Machining with AlCr-oxinitride PVD coated cutting tools.TribologyInternational (2013), http://dx.doi.org/10.1016/j.triboint.2013.03.020i.
Edlmayr et al. Microstructure and thermal stability of corundum-type (Al0.5Cr0.5)2O3 solid solution coatings grown by cathodic arc evaporation. Thin Solid Films 534 (2013) 373-379.
Bobzin et al. Thermal stability of γ-Al2O3 coatings for challenging cutting operations. Surface & Coatings Technology 205 (2010) 1444-1448.
Astrand et al. PVD-Al2O3-coated cemented carbide cutting tools. Surface & Coatings Technology 188-189 (2004) 186-192.

(Continued)

*Primary Examiner* — Michael P Wieczorek
(74) *Attorney, Agent, or Firm* — Larry R. Meenan

(57) ABSTRACT

A coated body having a substrate and a wear-resistant coating applied to the substrate by physical vapor deposition, the coating comprising a main layer applied to the substrate in a thickness of 1 to 10 μm, wherein said main layer is formed from a nitride of aluminum and at least one other metal from the group consisting of Ti, Cr, Si, Zr and combinations thereof; and a cover layer adjacent to the main layer at a thickness of 0.1 to 5 μm, wherein the cover layer comprises at least one alternating layer consisting of an oxynitride layer and a nitride layer arranged over the oxynitride layer, wherein the oxynitride layer is formed from an oxynitride of aluminum and optionally further metals from the group consisting of chromium, hafnium, zirconium, yttrium, silicon and combinations thereof, and the nitride layer is formed from a nitride of aluminum and at least one other metal from the group consisting of Ti, Cr, Si, Zr and combinations thereof.

15 Claims, No Drawings

(56) References Cited

FOREIGN PATENT DOCUMENTS

| | | |
|---|---|---|
| DE | 102016108734 | 11/2017 |
| EP | 0302984 A1 | 2/1989 |
| EP | 0408535 A1 | 1/1991 |
| EP | 0513662 B1 | 2/1996 |
| EP | 1354984 A2 | 10/2003 |
| EP | 1762637 A2 | 3/2007 |
| EP | 1717347 | 11/2008 |
| EP | 2082079 A1 | 7/2009 |
| EP | 2392688 A1 | 12/2011 |
| EP | 2418298 A1 | 2/2012 |
| JP | 2000309864 A | 11/2000 |
| WO | 2009003755 A3 | 10/2009 |
| WO | 2010108893 A1 | 9/2010 |
| WO | WO2017140787 | 8/2017 |
| WO | WO2017194372 | 11/2017 |

OTHER PUBLICATIONS

Schulz et al. Performance of oxide PVD-coatings in dry cutting operations. Surface and Coatings Technology 146-147 (2001) 480-485.
Zywitzki et al. Effect of the substrate temperature on the structure and properties of Al2O3 layers reactively deposited by pulsed magnetron sputtering. Surface and Coatings Technology 82 (1996) 169-175.
Frank Barthelmä et al. Oxygen-improved hard coatings for high performance cutting processes. Procedia CIRP 1 ( 2012 ) 208-213.
International Search Report and Written Opinion corresponding to PCT/EP2017/060592, dated Aug. 29, 2017, 15 pages.
Nov. 22, 2018 International preliminary report on patentability received.
Jul. 26, 2019 Foreign OA.
Jun. 24, 2020 Office Action (non-US) CN App. No. 109072408A.

\* cited by examiner

COATED BODY AND METHOD FOR PRODUCTION OF THE BODY

CROSS REFERENCE TO PRIORITY APPLICATIONS

This application is a U.S. National Phase of PCT/EP2017/060592, filed May 4, 2017, which claims the benefit of German Application Number 102016108734.3, filed May 11, 2016, each of which are incorporated herein by reference in their entireties.

The present invention relates to a coated body, in particular a cutting tool, comprising a substrate and a wear-resistant coating on the substrate, and a process for its preparation.

Cutting tools used for machining metals and metal alloys, such as steel and cast iron, typically consist of a main body and a coating applied to the main body, which may comprise one or more layers made of hard materials such as titanium nitride, titanium carbide, titanium carbon nitride, titanium aluminum nitride, and/or aluminum oxide. The coating is used to make the cutting insert harder and/or more wear-resistant and to improve the cutting properties. The CVD method (Chemical Vapor Deposition) and the PVD method (Physical Vapor Deposition) are used to apply the coating.

Arc evaporation (arc PVD) and cathode sputtering are particularly known as PVD methods. During sputtering, atoms are ejected from a cathode metal (target) due to bombardment of the target by energetic ions from a plasma and then deposited onto a substrate arranged in the vicinity of the target. In the presence of a reactive gas, conversion products from the target atoms and the reactive gas then form on the substrate. An inert gas such as argon is usually used as the sputtering gas to generate the plasma.

The PVD methods are typically used to deposit titanium nitride and titanium aluminum nitride. The adding of aluminum increases the hardness and oxidation-resistance of the titanium nitride coatings. The use of titanium-free coatings, such as AlCrN, which may be enriched with additional chemical elements such as silicon to improve the coating properties, is also known.

PVD methods for depositing hard aluminum oxide coatings use voltage-pulsed cathodes in order to prevent contamination of the metal target from the non-electrically-conducting aluminum oxide. Two magnetron atomization sources with aluminum targets can be connected to a sine-wave generator in order to generate the aluminum oxide coating such that the two atomization sources with a pulse-change frequency between 20 and 100 kHz act alternately as the anode and cathode of the sputtering arrangement.

U.S. Pat. No. 8,709,583 B2 discloses a cutting tool having a main body and a multilayer coating applied thereon, which comprises a first layer of TiAlN with a layer thickness of 1 to 5 µm and a second layer of aluminum oxide having a layer thickness of 1 to 4 µm, wherein the coating on the second layer consisting of aluminum oxide further comprises n layers of TiAlN and layers of aluminum oxide, each with a layer thickness of 0.1 to 0.5 µm, which are alternatingly applied on each other, wherein n relates to each individual layer and is an even number from 0 to 10, and wherein the total layer thickness of the coating is 2 to 16 µm, and the coating is produced by the PVD method.

US 2014/193637 A1 discloses a cutting tool having a substrate of hard metal, cermet, steel or high-speed steel (HSS) and a multilayer coating deposited thereon by the PVD method, which comprises a main layer of one or more identical or differing layers of a nitride or carbonitride arranged one above the other and a chromium-containing oxidic functional layer. The nitride or carbonitride of the main layer contains at least aluminum (Al) and optionally one or more further metals selected from Ti, Cr, Si, Y, Ru and Mo.

In order to improve the bonding of the chromium-containing functional layer, according to US 2014/193637A1 an intermediate layer is provided between the main layer and the functional layer, said intermediate layer consisting of one or more oxides or oxynitrides of the metals Al, Cr, Si and/or Zr, the intermediate layer having a cubic structure. The chromium-containing functional layer is selected from chromium oxide ($Cr_2O_3$), chromium oxynitride, aluminum chromium oxide ($(AlCr)_2O_3$), aluminum chromium oxynitride or a mixed oxide or mixed oxynitride of aluminum, chromium and other metals from the group Hf, Y, Zr and Ru, and has a rhombohedral structure.

DE 10 2010 052 687 discloses a multilayer oxynitride layer system with cubic AlN and AlON on substrates such as preferably HSS and hard metal. The layer system consists of a first bonding layer, preferably from the elements Cr, Al and N, with a layer thickness between 0.1 and 0.5 µm; a second support layer, preferably from the elements Cr, Al and N, with a layer thickness between 0.3 and 2.5 µm; an oxygen-containing intermediate layer, preferably from the elements Cr, Al, O and N, with a layer thickness between 0.3 and 2.5 µm, and an oxygen-containing oxynitride layer, preferably from the elements Cr, Al, O and N, with a layer thickness between 0.3 and 2.5 µm. In a second embodiment, a further cover layer of hard material such as TiAlN is provided.

DE 10 2013, 005, 437 also discloses a cutting tool with a coating of metal-oxide-nitride hard-material layers. The metal elements of the metal-oxide-nitride hard-material layers are deposited by physical gas phase deposition from at least one target, the target comprising at least one metal from the group Ti, Zr, Hf, V, Nb, Ta, Cr, Mo, W and Al, and preferably also at least one element from the group Y, Ni, B and Si, the target being used for the deposition of at least three layers by different processes but using the same process parameters except for the composition of the reactive gas. The first reference layer is a metal nitride layer of $Me_{p1}O_{n1}N_{m1}$ where $n1=0$, which is deposited using nitrogen as the reactive gas. The third reference layer is a metal oxide nitride layer of $Me_{p3}O_{n3}N_{m3}$ with an oxygen concentration n3 in atomic percent of not more than 30%, preferably between 20 and 30%. The second reference layer is a metal oxide nitride layer $Me_{p2}O_{n2}N_{m2}$ having an oxygen concentration n2 in atomic percent which is greater than n1 and less than n3, and is preferably in a range between 5% and 20%, wherein the second reference layer and the third reference layer are deposited using nitrogen and oxygen as the reactive gas. For the reference layers, it also holds true that $p1=p3=p2$ and $p1/(m1+n1)=p3/(m3+n3)=p2/(m2+n2)$. The reference layers should not contain oxide phases.

The object of the present invention is to provide further coatings for cutting tools with improved performance and increased service life for cutting various metals and metal alloys.

This object is achieved by a coated body according to the invention having a substrate and a wear-resistant coating applied to the substrate by physical vapor deposition, wherein the coating comprises:

a main layer applied to the substrate in a thickness of 1 to 10 µm, preferably 1 to 5 µm, wherein said main layer is formed from a nitride of aluminum and at least one other metal from the group consisting of Ti, Cr, Si, Zr and combinations thereof; and a cover layer adjacent to the main layer in a thickness of 0.1 to 5 µm, preferably 0.1 to 3 µm, wherein the cover layer comprises at least one alternating layer consisting of an oxynitride layer and a nitride layer arranged over the oxynitride layer, wherein the oxynitride layer is formed from an oxynitride of aluminum and optionally further metals from the group consisting of chromium, hafnium, zirconium, yttrium, silicon and combinations thereof, and the nitride layer is formed from a nitride of aluminum and at least one other metal from the group consisting of Ti, Cr, Si, Zr and combinations thereof; and wherein the oxynitride layer has a nitrogen component of less than 50 atomic percent with respect to the proportion of nitrogen and oxygen in the oxynitride layer.

By the incorporation of nitrogen and optionally other metals such as Cr, Hf, Zr, Y, and/or Si into the crystal lattice of aluminum oxide to form an oxynitride layer, it is surprisingly possible to considerably increase the service life of cutting tools with substrates coated according to the invention in the wet and/or dry milling of materials such as steel, in particular stainless steel (SS) or high-speed steel (HSS) and/or cast iron in comparison with cutting tools with known coatings. The provision of at least one alternating layer consisting of an oxynitride layer and nitride layer has the result that the cover layer can be made thinner overall without leading to a reduction in the service life of the coated cutting tool.

The inventors have recognized that the layers modified by the incorporation of nitrogen into the crystal lattice of aluminum oxide have a greater hardness compared to pure oxide layers. At the same time, wear resistance at high temperatures is improved. Compared to the nitride layers optionally doped with oxygen, the oxidation resistance of the coating according to the invention is improved, and an at least comparable hardness and wear resistance are achieved.

Suitable substrates for producing the coated body according to the invention are known. For example, the substrate may be made of a hard metal, cermet, cubic boron nitride (pcBN), steel, or high-speed steel.

In a preferred embodiment, the main layer of the coating consists of aluminum titanium nitride (AlTiN) and/or aluminum titanium silicon nitride (AlTiSiN), particularly preferably aluminum titanium nitride. Aluminum titanium nitride (AlTiN) is well suited as a main layer since it is very tough and hard and has outstanding wear properties, especially at the high temperatures that occur when metal is machined.

With a wear-resistant coated body according to the invention, the main layer typically has an Al:Ti atomic ratio of 60:40 to 70:30, preferably of 62:38 to 68:32. For all ranges, the stated final values are also included.

The cover layer adjoining the main layer in the coating can have from 1 to 10 iterations, preferably from 3 to 5 iterations, of the at least one alternating layer consisting of an oxynitride layer and nitride layer. The thickness of an alternating layer consisting of an oxynitride layer and nitride layer is preferably in a range from about 0.1 µm to 1 µm. The oxynitride layer and the nitride layer may each have a thickness in the range of 0.05 to 0.95 µm.

The oxynitride layer in the at least one alternating layer is preferably formed from an oxynitride of aluminum, especially $AlO_xN_{1-x}$, or an oxynitride of aluminum and chromium, in particular $(Al,Cr)O_xN_{1-x}$, particularly preferably from aluminum oxynitride, wherein $0.5<x\leq0.99$ in each case. The amount of chromium in the oxynitride of aluminum and chromium may be higher than, equal to or lower than the proportion of aluminum. Preferably, the oxynitride of aluminum and chromium is an oxynitride derived from aluminum oxide $Al_2O_3$ and doped with chromium.

The oxynitride layer particularly preferably contains in each case 1 to 30 atomic percent nitrogen, preferably 2 to 15 atomic percent. The nitrogen content in the oxynitride layer increases the bond to the nitride layer and/or the main layer, and thus improves the wear resistance of the coating.

It is further preferred that in the at least one alternating layer between the oxynitride layer and the nitride layer and optionally between successive alternating layers, one intermediate layer is provided in each case which is formed from an oxynitride of aluminum and at least one other metal from the group of Ti, Cr, Si, Zr and combinations thereof, preferably consisting of an oxynitride of aluminum and titanium, in particular $(Al,Ti)O_xN_{1-x}$ where $0<x<1$, wherein x and/or the ratio of Al/Ti may vary over the thickness of the intermediate layer. The intermediate layer preferably has an oxygen gradient, wherein the oxygen content in the intermediate layer increases in each case in the direction of the oxynitride layer and/or decreases in the direction of the nitride layer.

By arranging the intermediate layer between the oxynitride layer and the nitride layer lying above it in an alternating layer on the one hand, and on the other hand between the outer nitride layer of an alternating layer and the oxynitride layer of a further alternating layer following the alternating layer, an even better bond of the oxynitride layers and nitride layers to one another can be achieved. The wear resistance of the coating can thereby be further improved.

Furthermore, the intermediate layer can also be provided between the main layer and the at least one intermediate layer adjacent thereto. The intermediate layer is then applied directly to the main layer, and the at least one alternating layer lies directly on the intermediate layer. In this case as well, the intermediate layer is formed from an oxynitride of aluminum and at least one further metal from the group consisting of Ti, Cr, Si, Zr and combinations thereof, preferably from an oxynitride of aluminum and titanium, in particular $(Al,Ti)O_xN_{1-x}$ where $0<x<1$. The intermediate layer on the main layer may have an oxygen gradient increasing in the direction of the oxynitride layer and/or a variable ratio of Al/Ti over the thickness of the intermediate layer.

The intermediate layers preferably have a thickness in the range of less than 1 µm, preferably less than 0.5 µm and particularly preferably less than 0.2 µm. Particularly good results have been obtained, for example, with a layer thickness of the intermediate layers in a range from 5 to 100 nm.

Finally, for decorative purposes and/or as a usage indicator layer, the coating may have an outermost layer consisting of TI, ZrN, CrN or AlCrN or mixtures of these compounds that appear gold- to silver-colored. The outermost layer makes it possible to discern with the naked eye the wear on of a cutting edge of a cutting tool which has been provided with this outermost layer.

In a method for producing the wear-resistant coated body according to the invention, a coating is applied to a substrate, e.g. consisting of a hard metal, cermet, pcBN, steel or high-speed steel by physical vapor deposition, having a main layer with a thickness of 1 to 10 µm, preferably 1 to 5 µm, and particularly preferably from 3 to 4.5 µm, and a cover layer with a thickness of 0.1 to 5 µm, preferably 0.1 to 3 µm.

The main layer and the cover layer, including the at least two alternating layers consisting of an oxynitride layer and nitride layer and optionally the intermediate layers, may be substantially deposited by any PVD method which is suitable therefor. However, magnetron sputtering, reactive magnetron sputtering, dual magnetron sputtering, high-power-impulse magnetron sputtering (HIPIMS) or the simultaneous use of cathode sputtering (sputter deposition) and arc vaporization (arc PVD) are preferred. Particularly preferably, all layers of the coating are deposited by arc vapor deposition (arc PVD) since particularly hard and also dense layers can be deposited with this method. The inventors have further found that the droplets generated by means of arc PVD due to the process can be effectively aftertreated, and a stable and flexible production method for depositing the coating according to the invention is thus provided by this method.

It is decisive for the present invention that, in the method for producing the wear-resistant, coated body according to the invention, nitrogen is continuously supplied during the PVD process for applying the coating to the substrate, but is correspondingly controlled depending on the desired composition of the respective layers of the coating.

The subject-matter of the invention is thus also a method for producing a wear-resistant, coated body which comprises the following steps:

providing a substrate;

applying a main layer to the substrate in a thickness of 1 to 10 µm, preferably 1 to 5 µm, wherein the main layer is formed by physical vapor deposition from a nitride of aluminum and at least one further metal from the group consisting of Ti, Cr, Si, Zr and combinations thereof;

applying at least one oxynitride layer over the main layer, the oxynitride layer being formed by physical vapor deposition from an oxynitride of aluminum and optionally further metals from the group consisting of chromium, hafnium, zirconium, yttrium, silicon and combinations thereof;

applying a nitride layer over the oxynitride layer, the nitride layer being formed by physical vapor deposition from a nitride of aluminum and at least one further metal from the group consisting of Ti, Cr, Si, Zr and combinations thereof, and optionally repeating the steps of applying the oxynitride layer and the nitride layer;

characterized in that nitrogen is supplied continuously and regulated during deposition of the main layer, the oxynitride layer and the nitride layer.

Preferably the $N_2$ partial pressure lies in a range of 1 to 8 Pa, preferably 2 to 5 Pa and more preferably 3 to 4 Pa during the application of the main layer and/or a nitride layer in the at least one alternating layer of the cover layer.

In particular, a mixed Al/Ti cathode, optionally doped with Cr, Si and/or Zr, can be used as the cathode. The atomic ratio of the Al/Ti cathode preferably lies in the range 60:40 to 70:30. In this process step the cathode current preferably lies in a range of 150 to 250 A, more preferably in a range of 180 to 220 A.

In the process step for vapor deposition of the oxynitride layer, oxygen is supplied at a rate of 10 to 100 standard cubic centimeters/minute (sccm), preferably at a rate of 40 to 60 sccm. Here, according to the invention, nitrogen continues to be supplied while a nitrogen partial pressure is maintained in the range of 1 to 8 Pa, preferably 2 to 5 Pa, and more preferably 3 to 4 Pa. In particular, the nitrogen partial pressure during vapor deposition of the oxynitride layer can be regulated lower than when vapor-depositing the main layer or a nitride layer of the intermediate layer. Particularly preferably, the nitrogen partial pressure during the application of the oxynitride layer is about 70 to 90% of the partial pressure during the application of the nitride layer.

As a cathode for vapor deposition of the oxynitride layer, it is possible in particular to use an aluminum cathode, optionally doped with chromium, hafnium, zirconium, yttrium and/or silicon, and in particular a mixed Al/Cr cathode. The cathode current preferably lies in a range from 100 to 140 A during the application of the oxynitride layer.

Preferably, the amount of supplied oxygen is kept constant during vapor deposition of an oxynitride layer.

To form the intermediate layers before and/or after the application of an oxynitride layer, the oxygen supply can be supplied in the form of a rising or falling ramp with increasing or decreasing volume flow. In particular, the oxygen can be supplied with a stepwise or continuously increasing volume flow after deposition of a nitride layer in the direction of the subsequent oxide layer, and with stepwise or continuously decreasing volume flow after deposition of an oxynitride layer in the direction of the following nitride layer.

Preferably, the volume flow of oxygen supplied during the formation of the intermediate layer varies in a range from about 50% to 100% of the volume flow provided when applying the oxynitride layer. In the transition from the main layer or a nitride layer to an oxynitride layer, the oxygen volume flow is preferably regulated in the form of a rising ramp. In the transition from an oxynitride layer to an adjacent nitride layer, the volume flow of the oxygen is preferably regulated in the form of a falling ramp.

The nitrogen partial pressure is preferably maintained in a range from 1 to 8 Pa, preferably from 2 to 5 Pa, during the formation of the intermediate layer. In particular, the nitrogen partial pressure is regulated to be lower during the application of an intermediate layer than during application of a nitride layer. Particularly preferably, the nitrogen partial pressure during application of the intermediate layer is about 70% to 90% of the partial pressure during application of the nitride layer.

The cathode for applying the main layer and the nitride layer is preferably used together with a further aluminum cathode for applying the intermediate layer. Preferably, the cathode current at the aluminum cathode during the application of the intermediate layer is in the range of 100 to 140 A, and the cathode current at the Al/Ti cathode is in the range of 120 to 180 A, and preferably between about 120 and 160 A.

Further features and advantages of the present invention will become apparent from the following description of a preferred embodiment. However, the following examples only serve to illustrate the invention and are not to be construed in a restrictive sense.

PRODUCTION EXAMPLE 1

In a PVD coating system of the Innova™ type from the company Oerlikon Balzers, a substrate for a cutting tool made of tungsten carbide hard metal with about 10% by weight Co was provided by arc vapor deposition with a main layer consisting of AlTiN and a cover layer consisting of three successive alternating layers, each having an oxynitride layer consisting of $AlO_xN_{1-x}$ and a nitride layer consisting of AlTiN.

An intermediate layer of $AlTiO_xN_{1-x}$ having an oxygen gradient was deposited between the main layer and the oxynitride layer of the first alternating layer, between the oxynitride layer and the nitride layer of each alternating layer, and between the adjacent alternating layers in each case.

A cathode having a composition of Al67Ti33 (atomic %) was used to deposit the titanium-containing layers. For the total duration of coating the nitrogen partial pressure was controlled in a range from 3.0 to 3.5 Pa. Oxygen was supplied at a volume flow of 30 to 50 sccm during deposition of the oxynitride layers and the intermediate layers.

The AlTiN main layer had a thickness of 3.7 µm. The total thickness of the cover layer was 1.9 µm which resulted in a total thickness of the coating of 5.6 µm.

Further parameters of the coating deposited on the substrate are given in Table 1 below:

TABLE 1

| PVD coating system | | |
|---|---|---|
| Layer | Composition | Cathodes |
| Main layer | AlTiN | AlTi |
| Cover layer | | |
| Intermediate layer | $AlTiO_xN_{i-x}$ | AlTi/Al |
| Oxynitride layer | $AlO_xN_{i-x}$ | Al |
| Intermediate layer | $AlTiO_xN_{i-x}$ | AlTi/Al |
| Nitride layer | AlTiN | AlTi |
| Intermediate layer | $AlTiO_xN_{i-x}$ | AlTi/Al |
| Oxynitride layer | $AlO_xN_{i-x}$ | Al |
| Intermediate layer | $AlTiO_xN_{i-x}$ | AlTi/Al |
| Nitride layer | AlTiN | AlTi |
| Intermediate layer | $AlTiO_xN_{i-x}$ | AlTi/Al |
| Oxynitride layer | $AlO_xN_{i-x}$ | Al |
| Intermediate layer | $AlTiO_xN_{i-x}$ | AlTi/Al |
| Nitride layer | AlTiN | AlTi |

PRODUCTION EXAMPLE 2

A substrate for a tungsten carbide hard-metal cutting tool having about 10% by weight Co was provided in a PVD coating system by arc vapor deposition with a main layer of AlTiN and a cover layer consisting of a single alternating layer with an oxynitride layer of $(Al,Cr)O_xN_{1-x}$ and a nitride layer of AlTiN.

An intermediate layer of $(Al,Cr)TiO_xN_{1-x}$ with an oxygen gradient was deposited in each case between the main layer and the oxynitride layer of the intermediate layer, and between the oxynitride layer and the nitride layer in the intermediate layer.

The layers were in each case deposited according to the parameters specified in Production Example 1. To deposit the oxynitride layer as well as the intermediate layer, a cathode with a composition Al70Cr30 (atomic %) was used instead of the aluminum cathode. The main layer and the nitride layer were each deposited using an AlTi cathode.

The AlTiN main layer had a thickness of 3.6 µm. The total thickness of the cover layer was 0.8 µm which resulted in a total thickness of the coating of 4.4 µm.

PRODUCTION EXAMPLE 3

In a PVD coating system, a hard metal substrate for a cutting tool was produced consisting of 85.5% by weight tungsten carbide, 2.5% by weight mixed carbides and 12% by weight Co having a main layer of AlTiN and a cover layer of three successive intermediate layers, each having an oxynitride layer of $AlO_xN_{1-x}$ and a nitride layer of AlTiN.

An intermediate layer of $AlTiO_xN_{1-x}$ having an oxygen gradient was deposited between the main layer and the oxynitride layer of the first alternating layer, between the oxynitride layer and the nitride layer of each alternating layer, and between the adjacent alternating layers in each case. The further coating parameters corresponded to those of Production Example 1.

The AlTiN main layer had a thickness of 3.5 µm. The total thickness of the cover layer was 1.8 µm, so that a total thickness of the coating of 5.3 µm resulted.

PRODUCTION EXAMPLE 4

A hard metal substrate was provided in a PVD coating system for a cutting tool consisting of 81.5% by weight tungsten carbide, 10.5% by weight cubic mixed carbides and 8% by weight Co with a main layer of AlTiN and a cover layer of three successive alternating layers, each with an oxynitride layer of $(Al,Cr)O_xN_{1-x}$ and a nitride layer of AlTiN.

Between the main layer and the oxynitride layer of the alternating layer, as well as between the oxynitride layer and the nitride layer in the alternating layer in each case, an intermediate layer was deposited of $(Al,Cr)TiO_xN_{1-x}$ having an oxygen gradient.

The layers were deposited according to the parameters specified in Production Example 1. To deposit the oxynitride layers as well as the intermediate layers, a cathode with a composition Al85Cr15 (atomic %) was used in place of the aluminum cathode.

The AlTiN main layer had a thickness of 3.1 µm. The total thickness of the cover layer was 1.8 µm, so that a total thickness of the coating of 4.9 µm resulted.

COMPARATIVE EXAMPLE 1

For comparison, the hard metal substrates of Production Examples 1 to 4 were provided with an AlTiN coating by arc vapor deposition in a PVD coating system of the Innova™ type from the company Oerlikon Balzers. The Al:Ti atomic ratio was about 67:33. The AlTiN coating had a thickness in the range of about 3.3 to 4.1 µm.

COMPARATIVE EXAMPLE 2

In a PVD coating system, a hard metal substrate was provided for a cutting tool of 85.5% by weight tungsten carbide, 2.5% by weight mixed carbides and 12% by weight Co with a main layer of AlTiN and a cover layer of a single alternating layer with an oxynitride layer of $(Al,Cr)_2O_3$ and a nitride layer of AlTiN. To deposit the oxynitride layer, a cathode was used with an atomic ratio of Al:Cr of 70:30.

The AlTiN main layer had a thickness of 2.8 µm. The total thickness of the cover layer was 2.0 µm, so that a total thickness of the coating of 4.8 µm resulted.

Cutting Test 1

Cutting tools according to Production Example 1 with a cutting plate geometry of HNGJ0905ANSN-GD were used in milling tests using a 6-tooth face milling cutter on a workpiece made of steel of type 1.4301, and compared with corresponding cutting tools coated according to Comparative Example 1.

The milling cutter was operated in a single-tooth test with a cutting speed vc of 120 m/min and a cutting depth ap of 1 mm at a contact width of 55 mm. The tooth feed was 0.25 mm. The milling was carried out dry without cooling.

The end of service life was defined by a flank wear>0.2 mm, or fracture of the cutting edge.

A service life of 7.5 m milling length was achieved with the coated cutting tools according to the invention. The service life of the coated cutting tools according to Comparative Example 1 was only 4.5 m.

Cutting Test 2

Cutting tools according to Production Example 1 with a cutting plate geometry of HNGJ0905ANSN-GD were used in milling tests using a 6-tooth face milling cutter on a workpiece made of steel of type 1.4301, and compared with corresponding cutting tools coated according to Comparative Example 2.

The milling cutter was operated in a single-tooth test with a cutting speed vc of 100 m/min and a cutting depth ap of 1 mm at a contact width of 55 mm. The tooth feed was 0.25 mm. Milling was carried out with emulsion cooling.

The end of service life was defined by a flank wear>0.2 mm, or fracture of the cutting edge.

A service life of 2.4 m milling length was achieved with the coated cutting tools according to the invention. The service life of the cutting tools coated according to Comparative Example 1 was only 1.8 m.

Cutting Test 3

Cutting tools according to Production Example 3 with a cutting plate geometry of XPHT160412 were used in milling tests using a 6-tooth face milling cutter on a workpiece made of steel of type 1.4301, and compared with corresponding cutting tools coated according to Comparative Examples 1 and 2.

The milling cutter was operated in a single-tooth test with a cutting speed vc of 250 m/min and a cutting depth ap of 2.5 mm at a contact width of 24 mm. The tooth feed was 0.15 mm. The milling was carried out without cooling.

The end of service life was defined by a flank wear>0.3 mm, or fracture of the cutting edge.

A service life of 2.1 m milling length was achieved with the coated cutting tools according to the invention. The service life of the cutting tools coated according to Comparative Examples 1 and 2 was only 1.2 m in each case.

Cutting Test 4

Cutting tools according to Production Example 4 with a cutting plate geometry of XPHT160412 were used in milling tests using a 6-tooth face milling cutter on a workpiece made of spheroidal graphite of type EN-GJS-700, and compared with corresponding cutting tools according to Comparative Example 1.

The milling cutter was operated in a single-tooth test with a cutting speed vc of 250 m/min and a cutting depth ap of 1 mm at a contact width of 20 mm. The tooth feed was 0.25 mm. The milling was carried out without cooling.

The end of service life was defined by a flank wear>0.1 mm, or fracture of the cutting edge.

A service life of 12.8 m milling length was achieved with the coated cutting tools according to the invention. The service life of the cutting tools coated according to Comparative Example 1 was only 9.0 m.

The coating according to the invention thus enables an extension of the service life of the cutting tools by more than 30%, sometimes considerably more than 70%.

The invention claimed is:

1. Coated body having a substrate and a wear-resistant coating applied to the substrate by physical vapor deposition, the coating comprising:
    a main layer applied to the substrate in a thickness of 1 to 10 μm, wherein said main layer is formed from a nitride of aluminum and at least one other metal from the group consisting of Ti, Cr, Si, Zr and combinations thereof; and
    a cover layer adjacent to the main layer in a thickness of 0.1 to 5 μm, wherein the cover layer comprises at least one alternating layer consisting of an oxynitride layer, an intermediate layer formed from an oxynitride of aluminum and at least one other metal from the group consisting of Ti, Cr, Si, Zr and combinations thereof, and a nitride layer arranged over the oxynitride layer and the intermediate layer, wherein the oxynitride layer is formed from an oxynitride of aluminum and optionally further metals from the group consisting of chromium, hafnium, zirconium, yttrium, silicon and combinations thereof, and the nitride layer is formed from a nitride of aluminum and at least one other metal from the group consisting of Ti, Cr, Si, Zr and combinations thereof; and
    wherein the oxynitride layer has a nitrogen component of less than 50 atomic percent with respect to the proportion of nitrogen and oxygen in the oxynitride layer.

2. The coated body according to claim 1, characterized in that the main layer of the coating consists of aluminum titanium nitride.

3. The coated body according to claim 1, wherein the main layer has an Al:Ti atomic ratio in a range from 60:40 to 70:30.

4. The coated body according to claim 3, characterized in that the main layer has an Al:Ti ratio in a range of 62:38 to 65:35.

5. The coated body according to claim 1, characterized in that the cover layer adjoining the main layer in the coating has 1 to 10 iterations of the at least one alternating layer.

6. The coated body according to claim 1, characterized in that the thickness of an alternating layer consisting of the oxynitride layer, the intermediate layer and the nitride layer is in a range from 0.1 μm to 1 μm.

7. The coated body according to claim 1, characterized in that the oxynitride layer in the at least one alternating layer is formed from an oxynitride of aluminum or oxynitride of aluminum and chromium.

8. The coated body according to claim 7, characterized in that the at least one alternating layer is formed from $AlO_xN_{1-x}$ with $0.5<x\leq0.99$.

9. The coated body according to claim 7, characterized in that the at least one alternating layer is formed from $(Al,Cr)O_xN_{1-x}$ with $0.5<x\leq0.99$.

10. The coated body according to claim 1, characterized in that the oxynitride layer in each case consists of 1 to 30 atomic % nitrogen.

11. The coated body according to claim 10, characterized in that the oxynitride layer consists of 2 to 15 atomic % nitrogen.

12. The coated body according to claim 1, characterized in that the intermediate layer consists of an oxynitride of aluminum and titanium.

13. The coated body according to claim 1, characterized in that the intermediate layer is further arranged between the main layer and the at least one intermediate layer adjacent thereto.

14. The coated body according to claim 1, characterized in that the coating comprises an outermost layer of TiN, ZrN, CrN and/or AlCrN overlying the cover layer.

15. The coated body according to claim 1, characterized in that the intermediate layer consists of $(Al,Ti)O_xN_{1-x}$ with $0<x<1$.

* * * * *